United States Patent

Schulz-Harder

Patent Number: 5,676,855
Date of Patent: Oct. 14, 1997

[54] MULTIPLE SUBSTRATE AND PROCESS FOR ITS PRODUCTION

[76] Inventor: Jurgen Schulz-Harder, Hugo-Dietz-Strasse 32, D-91207 Lauf, Germany

[21] Appl. No.: 547,815

[22] Filed: Oct. 25, 1995

Related U.S. Application Data

[62] Division of Ser. No. 253,855, Jun. 3, 1994, Pat. No. 5,508,089.

[30] Foreign Application Priority Data

Jun. 3, 1993 [DE] Germany ............... 43 18 484.7
Jun. 16, 1993 [DE] Germany ............... 43 19 944.5

[51] Int. Cl.$^6$ ............... B44C 1/22; C03C 15/00
[52] U.S. Cl. ............... 216/52; 216/33; 216/65; 216/76; 216/13
[58] Field of Search ............... 156/643.1, 648.1, 156/657.1; 216/33, 52, 65, 76, 13; 437/226, 227

[56] References Cited

U.S. PATENT DOCUMENTS 3,781,975  1/1974  Ressel et al. ............... 437/227 X
3,926,746  12/1975  Hargis ............... 437/22.7
5,185,295  2/1993  Goto et al. ............... 437/226

FOREIGN PATENT DOCUMENTS 0149923  12/1984  European Pat. Off. .
3906690  10/1989  Germany .
3931996  4/1990  Germany .
3939794  6/1991  Germany .

*Primary Examiner*—William Powell
*Attorney, Agent, or Firm*—Hoffman, Wasson & Gitler

[57] ABSTRACT

A process for producing a metal coated substrate with an improved resistivity to cyclic temperature stress is provided. The substrate is provided with at least one insulating layer and at least one metal layer attached to at least one side of the insulating layer. The metal layer is made at least 0.2 millimeters thick, and is weakened in places by openings formed in at least one border area.

9 Claims, 4 Drawing Sheets

MULTIPLE SUBSTRATE AND PROCESS FOR ITS PRODUCTION

This is a divisional of application Ser. No. 08/253,855 filed on Jun. 3, 1994, now U.S. Pat. No. 5,508,089.

The invention relates to a multiple substrate according to the preamble of claim 1 and to a process for producing one such multiple substrate.

Ceramic-metal substrates and thus especially also ceramic-copper substrates are known. These substrates are used for producing electrical circuits, especially power circuits.

In the simplest case these substrates have a ceramic layer which is provided on both surface sides with a metal coating each, of which, for example, the metal coating on the top of the ceramic layer is structured, for example, using an etching technique such that this metal coating then forms the printed conductors, contact surfaces, etc. required for the circuit.

For efficient fabrication of electrical circuits, production of these circuits in multiple panels is also known, i.e., especially structuring of metal surfaces to achieve the necessary printed conductors, contact surfaces, etc., but also outfitting with electrical components on a multiple panel which is then separated after completion of structuring, but preferably after assembly, into individual circuit substrates or into individual circuits.

If this technique is to be used for efficient fabrication of metal-ceramic substrates for electrical circuits or electrical circuits produced using these substrates, a multiple metal-ceramic substrate is necessary which forms several panels on an individual ceramic layer. On these panels the ceramic layer is provided on at least one surface side with a metal coating, in which the metal coatings are not joined to one another on adjacent panels of course, but are separated from one another at least on the transition between adjacent panels.

Since the ceramic layer of a multiple substrate of this type has a relatively large area and there is no continuous metal coating or metal layer on any surface side of this ceramic layer, unwanted breaking of the ceramic layer, for example, during structuring of the metal surfaces to accomplish the necessary printed conductors, contact surfaces, etc. or in other treatment processes cannot be precluded with certainty even with careful handling.

The problem of the invention is to devise a multiple substrate which avoids these defects and in which, in spite of a host of panels formed on a common ceramic layer with metal coatings separated from panel to panel in each case, the danger of unwanted breaking of the ceramic layer or the multiple substrate is effectively prevented.

To solve this problem a multiple substrate according to the characterizing part of patent claim 1 is formed.

One preferred process for producing the multiple substrate is the subject matter of the characterizing part of patent claim 18.

In the invention the predetermined breaking lines or their extensions which run between the panels are bridged by at least one additional metal surface so that bending forces which could lead to unwanted breaking of the multiple substrate during treatment are at least partially accommodated by this additional metal surface and thus breaking of the multiple substrate is effectively prevented. Even if a break should occur, the multiple substrate is held together accurately to size by the additional metal surface (ductile metal layer). Preferably on both surface sides of the ceramic layer there are these additional metals surfaces on at least one border area.

For a large number of panels they are formed in several rows offset to one another in a first axial direction on the ceramic layer, each row having several adjoining panels. In this case then on at least two border areas which lie outside the panels and which adjoin one another at right angles there is one additional metal surface each. Each border area adjoins adjacent panels via an external predetermined breaking line. The additional metal surface on each border area bridges the predetermined breaking lines which run transversely or perpendicularly to this border area between the panels, or the imaginary extensions of the breaking lines and the metal surface on one of the border areas, additionally that external predetermined breaking line or its extension which is provided between the other border area and bordering panels. The external predetermined breaking line between the one border area and the bordering panels or the imaginary extension of this predetermined breaking line is not bridged in this case by any additional metal surface. By means of this configuration the desired breaking of the multiple substrate into individual substrates or into individual circuits is possible only in a certain sequence such that first one border area on the external predetermined breaking line which runs parallel to this border area is broken off and subsequently the other border area on the external predetermined breaking line which runs parallel to this border area is broken off. Only then is separation of the individual panels by breaking possible.

The multiple substrate can be easily handled in a treatment process such that breaking cannot occur on the external predetermined breaking line which runs parallel to one border area, with which then unwanted breaking on other predetermined breaking lines is also precluded.

Developments of the invention are the subject matter of the subclaims.

The invention is detailed below using the Figures on one example of an embodiment.

Figure 1:
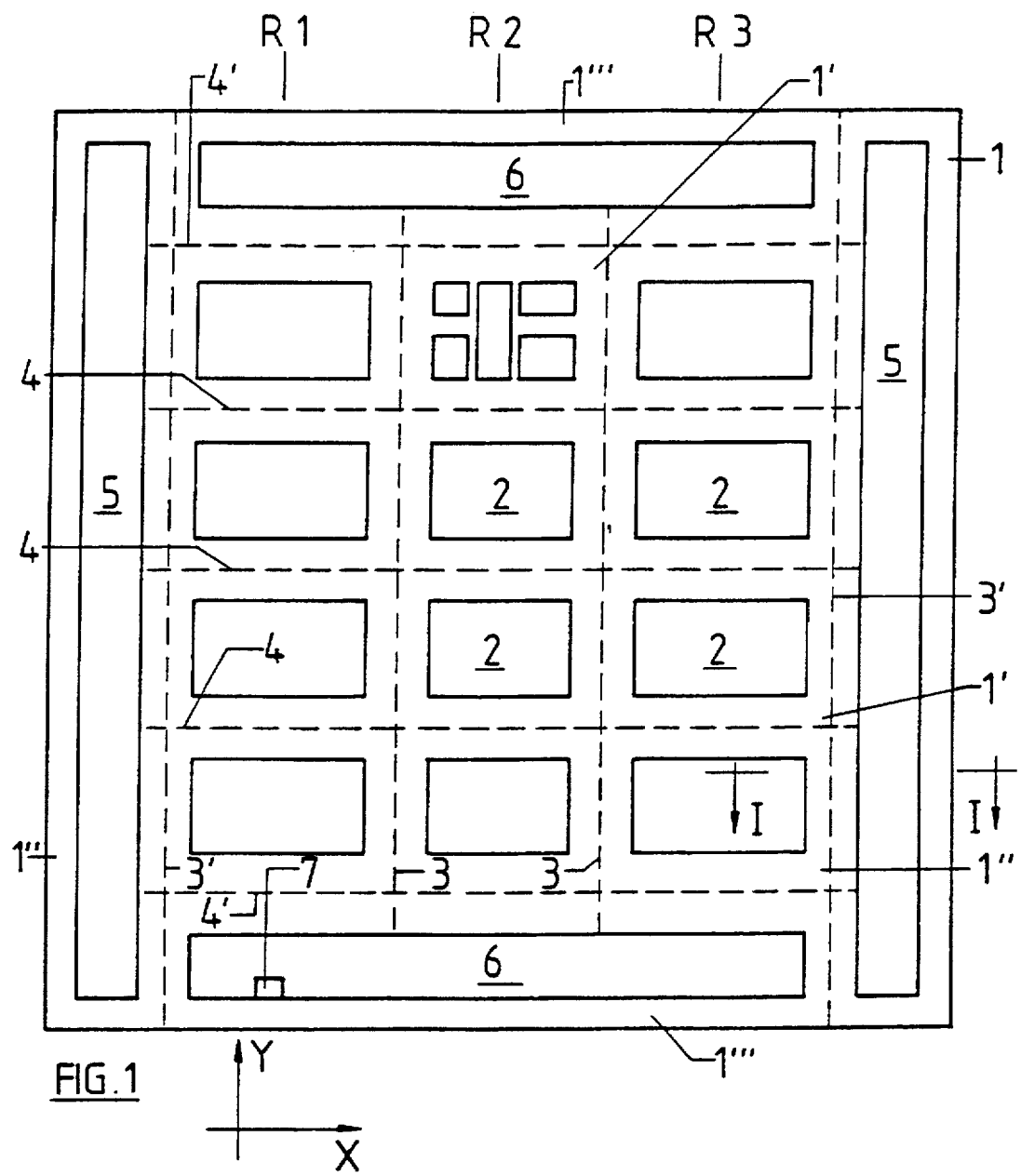
FIG. 1 shows in a simplified representation and an overhead view a multiple substrate according to the invention.
Figure 2:
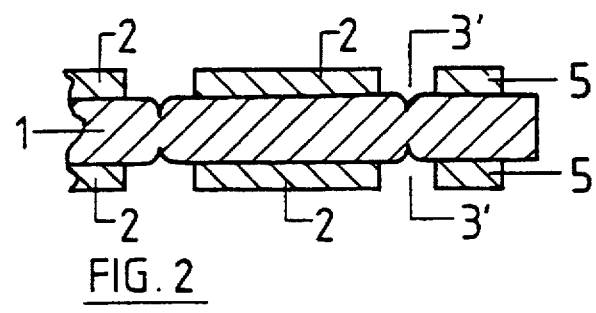
FIG. 2 shows a section according to line I—I of FIG. 1.

The multiple substrate shown in FIGS. 1 and 2 consists essentially of ceramic layer 1 which is, for example, an aluminum nitride ceramic or an aluminum oxide ceramic and in the embodiment shown is provided with a large number of metal coatings in the form of rectangular metal surfaces 2 on both surface sides. These metal surfaces 2 which consist of copper and are each joined flat to the respective surface side of ceramic layer 1 have each the same shape and size in the embodiment shown and are each made rectangular. Directly opposite each metal surface 2 on one surface side of ceramic layer 1 is metal surface 2 on the other surface side of this ceramic layer. Metal surfaces 2 on one surface side are structured as illustrated in FIG. 1 only for one of metal surface 2 for the sake of simpler representation.

It goes without saying that the metal surfaces can also have a shape deviating from rectangular and/or metal surfaces 2 on each surface side of ceramic layer 1 or on the two surface sides of this ceramic layer can be differently shaped.

There are metal surfaces 2 on the two surface sides of ceramic layer 1 in several rows and in the embodiment shown in a total of three rows R1–R3, of which each has four metal surfaces. Metal surfaces 2 which follow each other in succession in rows R1–R3 and also the metal surfaces of adjacent rows are each spaced at a distance from one another on both surface sides of ceramic layer 1 such that the center lines lie parallel to rows R1–R3 and perpendicular to them between adjacent metal surfaces 2 on one surface side of ceramic layer 1 congruently with the corresponding center lines on the other surface side of this ceramic layer.

Along this center line the ceramic layer on both surface sides is provided with predetermined breaking lines 3 (parallel to rows R1–R3) and with predetermined breaking lines 4 (perpendicularly to rows R1–R3). Ceramic layer 1 is divided into a host of panels 1' by predetermined breaking lines 3 and 4 and other predetermined breaking lines 3' and 4'.

On the border of rectangular ceramic layer 1 in the embodiment shown the layer has on one surface side additional metal coatings in the form of strip-shaped metal surfaces 5 and 6, of which there are metal surfaces 6 each along one border area 1'" of ceramic layer 1 running parallel to predetermined breaking lines 4 and 4' and there are metal surfaces 5 on border area 1" which runs parallel to rows R1–R3 or predetermined breaking lines 3 and 3'. Between these additional, longitudinally stretched out metal coatings 5 and 6 and adjacent metal surfaces 2 or panels 1' there are predetermined breaking lines 3' and 4' on the two surface sides of ceramic layer 1. It goes without saying that predetermined breaking lines 3 and 4 or 3' and 4' are provided on the two surface sides of ceramic layer 1 such that directly opposite one predetermined breaking line 3 or 4 or 3' or 4' on one surface side at a time is a corresponding predetermined breaking line 3 or 4 or 3' or 4' on the other surface side.

In the embodiment shown the additional metal surfaces are dimensioned and arranged such that predetermined breaking lines 3' between metal surfaces 2 and metal surfaces 5 extend as far as the border of ceramic layer 1 by the fact that metal surfaces 5 are each arranged with their narrower sides or ends on a common imaginary line with the long side of metal surfaces 6 which lies outlying, i.e., facing away from metal surfaces 2, however metal surfaces 5 and 6 do not directly adjoin one another, but are spaced at a distance from one another.

Predetermined breaking lines 3' which run between metal surfaces 2 and additional metal surfaces 5 are cut by all predetermined breaking lines 4 and 4'.

With the exception of predetermined breaking lines 3' which run between metal surfaces 2 and additional metal surfaces 5 predetermined breaking lines 3 end on additional metal surfaces 6. In the same way all predetermined breaking lines 4 and 4' end on additional metal surfaces 5.

In the preferred configuration of this embodiment predetermined breaking lines 4 and 4' end on external predetermined breaking lines 3' and predetermined breaking lines 3 end on external predetermined breaking lines 4'.

Basically it is possible to provide additional metal surfaces 5 and 6 on the two surface sides of ceramic layer 1 or only on one surface side.

Metal surfaces 2, 5 and 6 are preferably surfaces of copper.

The described multiple substrate is produced for example by applying to the two surface sides of ceramic layer 1 a metal layer which completely or almost completely covers these surface sides in the form of a metal foil or thin metal plate which is joined flat to the respective surface side of ceramic layer 1 by means of a direct bonding process or active brazing process which are known to one skilled in the art from the literature and which are also called the DCB process (direct copper bonding process) or AMB (active metal brazing process) when using foils or thin plates of copper.

Individual metal surfaces 2, 5 and 6 are then produced by subsequent prestructuring of the continuous metal layers on the two surface sides of ceramic layer 1. This structuring can be done using the most varied processes, for example by etching and/or mechanical processes. After structuring, i.e., after formation of metal surfaces 2, 5 and 6, using suitable techniques predetermined breaking points or predetermined breaking line 3, 4, 3', 4' are formed, for example, by laser treatment or mechanical processes.

It is also possible to apply predetermined breaking lines 3, 4, 3', and/or 4' before metal coating. By subsequent structuring, preferably by masking and etching, the predetermined breaking lines are then exposed during etching.

Furthermore, it is also possible to join already structured metal surfaces with the ceramic by the DCB process or by the AMB process, predetermined breaking lines 3, 4, 3' and/or 4' being produced either before or after joining the metal surfaces.

In the described prestructured form the multiple substrate is delivered by the substrate manufacturer to the user who then processes this substrate as multiple panels in the production of electrical circuits, especially power circuits, for example, assembled by machine with the required components. Only after this assembly and if necessary after testing of circuits produced is the multiple panel separated into individual circuits by breaking ceramic layer 1 along predetermined breaking lines 3, 4, 3', and 4'. By means of additional metal surfaces 5 and 6 unwanted breaking of the multiple substrate or multiple panel in the process is effectively prevented. Because predetermined breaking lines 3' which run between metal surfaces 2 and additional metal surfaces 5 extend as far as the border of ceramic layer 1, the multiple panel can be divided into different individual substrates or circuits without the necessity of dividing one of the additional metal surfaces 5 and 6, i.e., when the multiple panel is separated into individual panels or individual substrates or into individual circuits breaking takes place first on the external predetermined breaking lines 3' adjacent to metal surfaces 5 and then on external predetermined breaking lines 4' adjacent to metal surfaces 6, with which then the border which has these additional metal surfaces 5 and 6 is removed and the remaining part of the multiple substrate can then be separated without problems on predetermined breaking lines 3 and 4 by breaking.

Although predetermined breaking lines 3' extend as far as the border of ceramic layer 1 there is no danger that the multiple substrate will break in an unwanted manner during the process along these external predetermined breaking lines 3', since especially when the multiple substrate in the process is always seized during handling on two opposite side borders, no bending forces occur which could cause the substrate to break on outlying predetermined breaking lines 3'. Basically, however, it is also possible to handle the multiple substrate in the process such that this substrate is always seized only on border areas 1'" which have metal surfaces 6.

Metal surfaces 5 and 6 can also be provided with structuring which forms coding, for example, recesses 7 which form coding. This coding which can be read by automatic machinery can then contain information about the type of circuits to be produced and can thus be used to control and/or monitor the production process, but also to securely set a stipulated orientation of the multiple substrate in a processing devise.

Figure 3:
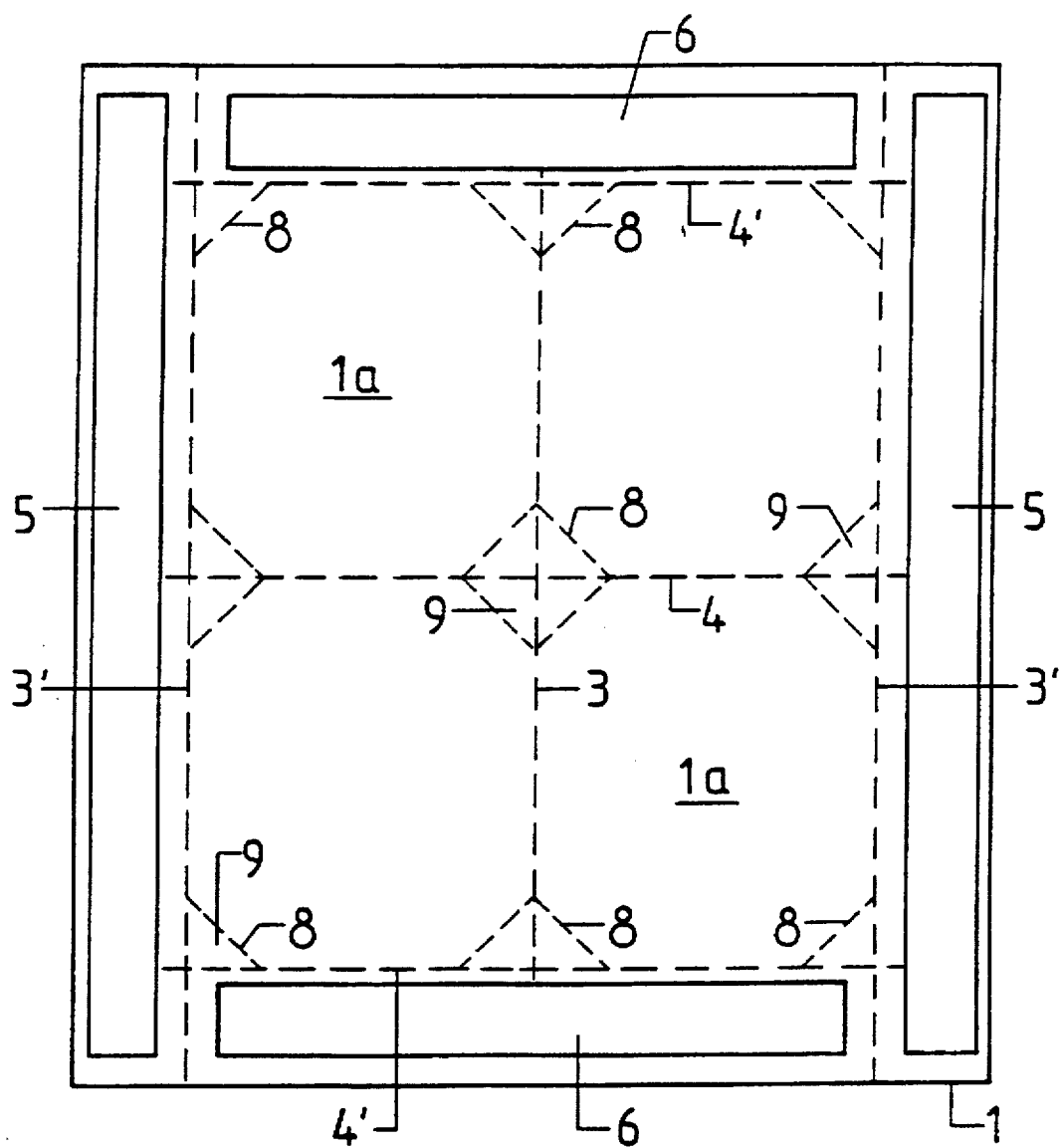
FIGS. 3–5 show in a similar representation to FIG. 1 other possible embodiments of the multiple substrate according to the invention.

FIG. 3 shows as another possible embodiment of the invention a multiple substrate which in turn consists of the ceramic layer, metal surfaces on ceramic layer 1 which are not shown in this figure, and additional metal surfaces 5 and 6. Ceramic layer 1 is in turn provided with predetermined breaking lines 3, 4, 3' and 4' which run at right angles to one another. Furthermore, in ceramic layer 1 for this multiple substrate there are short straight predetermined breaking lines 8, of which each ends with one end on predetermined breaking line 3 or 3' and with its other end on predetermined breaking line 4 or 4' and with these predetermined breaking lines encloses an angle less than 90° which opens toward the intersection point of the pertinent predetermined breaking lines 3, 3', 4, or 4', such that the respective panel defined by predetermined breaking lines has the shape of a square or rectangle with beveled corners.

Separation of the multiple substrate according to FIG. 3 into individual panels 1a takes place in the same manner as was described above for the substrate according to FIG. 1, solely with the difference that at the conclusion breaking takes place long predetermined along predetermined breaking lines 8. The remnants 9 which arise in this process are discarded.

Figure 4:
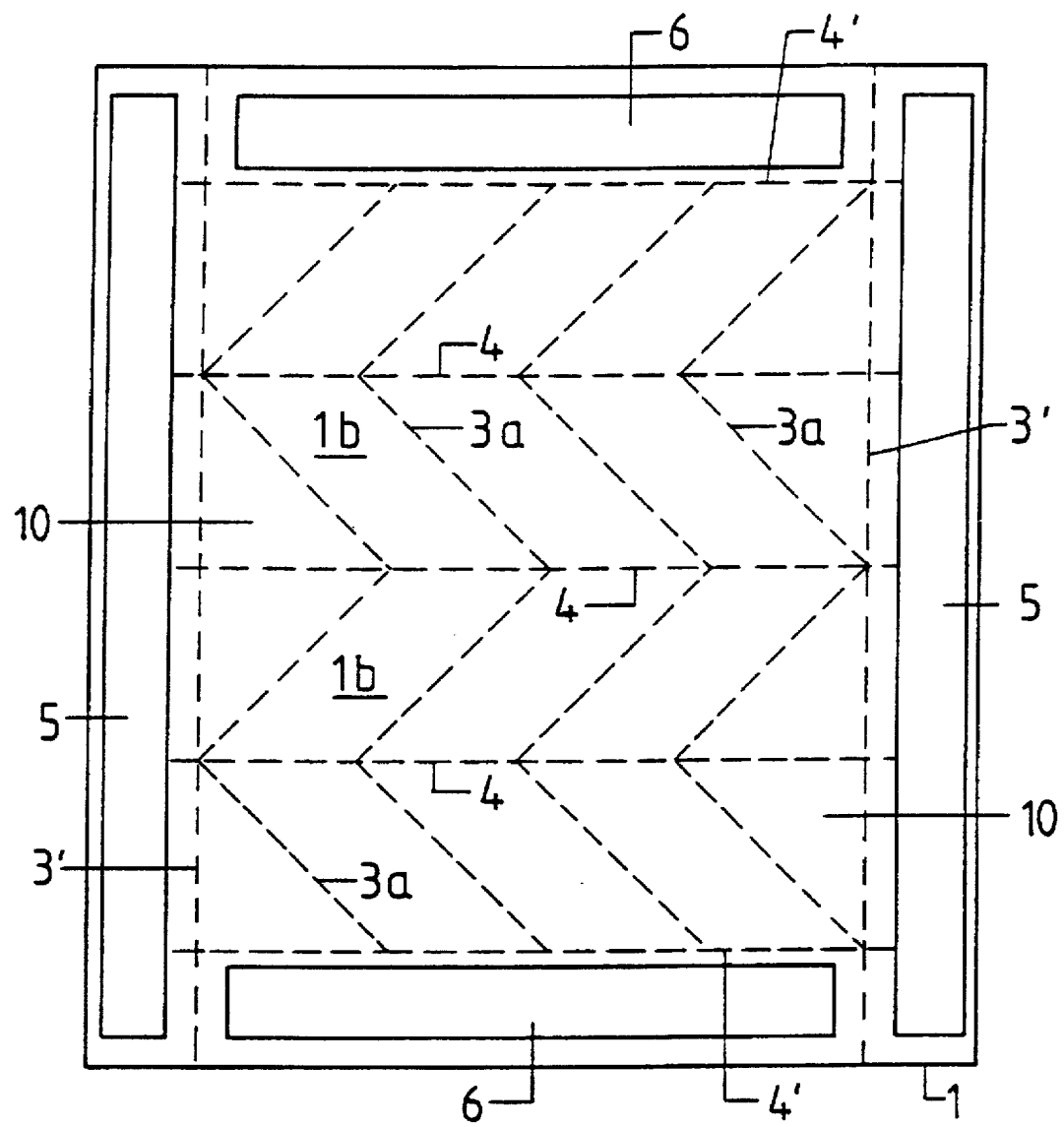

FIG. 4 shows a multiple substrate in which simply predetermined breaking lines 3', 4, and 4' run in a straight line, instead of predetermined breaking lines 3 zig-zag shaped predetermined breaking lines 3a are provided with an inflection point each on one predetermined breaking line 4, so that these predetermined breaking lines 3a in conjunction with predetermined breaking lines 4 define panels 1b in the shape of a parallelogram. In the same manner as the substrate of FIG. 3 the multiple substrate of FIG. 4 in turn has additional metal surfaces 5 and 6. Division of the multiple substrate into individual panels 1b takes place again by breaking in the manner as was described for the multiple substrate of FIG. 1, however after separation of border areas 1" and 1'" breaking taking place first on predetermined breaking lines 4 so that as the intermediate product several strips are obtained which can then be broken on predetermined breaking lines 3a. The triangular remnants 10 which are formed between external predetermined breaking lines 3' or between border areas 1" and adjacent panels 1b are scrap and are discarded.

Figure 5:
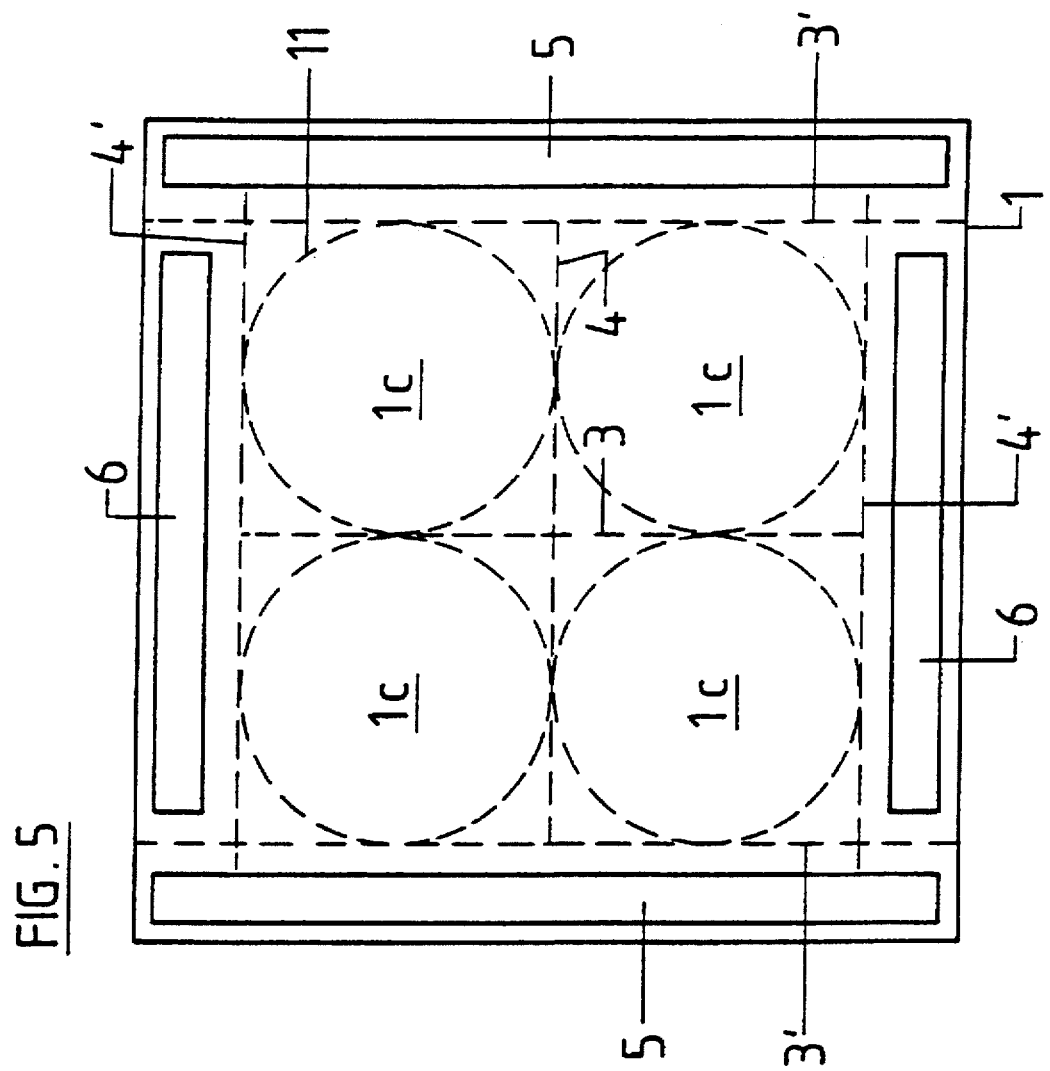

FIG. 5 finally shows as another possible version a multiple substrate which is very similar to the multiple substrate of FIG. 3, but which differs from the latter in that instead of short straight predetermined breaking lines 8 arc-shaped predetermined breaking lines 11 are provided and in addition to predetermined breaking lines 3, 4, 3' and 4'. In the version shown in FIG. 5 each four predetermined breaking lines 11 come together to form a circle which is enclosed by predetermined breaking lines 3 and 3' and by two predetermined breaking lines 4 or predetermined breaking lines 4'. Each individual panel is shaped roughly like a round disk in this version.

The invention was described above using examples of embodiments. It goes without saying than numerous changes and modifications are possible without departing from the inventive idea underlying the invention. Thus, for example, it is possible to provide predetermined breaking lines 3, 3a, 4, 3' and/or 4' only on one surface side of ceramic layer 1. Furthermore, it is possible to provide additional metal surfaces 5 and 6 on the two surface sides of ceramic layer 1.

I claim:

1. A process for producing a multiple substrate having a ceramic layer which forms at least two integral adjoining panels which are provided on at least one surface side of said ceramic layer with at least one metal coating, comprising at least one break line in said ceramic layer delineating where said at least two panels adjoin one another, an additional metal surface bridging said at least one break line between said at least two panels on at least one margin area of said ceramic layer outside said at least two panels on at least one surface side of said ceramic layer, and an external additional break line defining said margin area in said ceramic layer between said at least one additional metal surface and a remaining part of said ceramic layer, said remaining part forming said adjoining panels, comprising the steps of:

providing a metal layer on said at least one surface side and forming from said metal layer, metal coatings and at least one additional metal surface provided on at least one border area using a structuring process, said metal coatings and at least one additional metal surface provided on at least one border area, being formed from said metal layer.

2. A process according to claim 1, further comprising the step of producing breaking lines after completion of structuring.

3. A process according to claim 1, further comprising the step of producing breaking lines before structuring.

4. A process according to claim 1, wherein said structuring process is one of an etching technique, mechanical treatment, and an etching technique and mechanical treatment.

5. A process according to claim 1, wherein said metal layer forming step comprises flat joining of one of a metal foil and thin metal plate to said ceramic layer by one of direct bonding and active brazing process.

6. A process according to claim 2, comprising the step of producing said break lines by mechanical treatment.

7. A process according to claim 6, wherein said mechanical treatment is one of scratching and laser treatment.

8. A process according to claim 3, comprising the step of producing said break lines by mechanical treatment.

9. A process according to claim 8, wherein said mechanical treatment is one of scratching and laser treatment.

* * * * *